(12) United States Patent
Kochiyama et al.

(10) Patent No.: US 8,858,751 B2
(45) Date of Patent: Oct. 14, 2014

(54) METHOD FOR PRODUCING FLEXIBLE METAL LAMINATE

(75) Inventors: Takuro Kochiyama, Ube (JP); Hiroto Shimokawa, Ube (JP); Yoshitaka Mineki, Tokyo (JP); Masami Sasaki, Tokyo (JP)

(73) Assignees: Ube Industries, Ltd., Yamaguchi-Ken (JP); Ube-Nitto Kasei Co., Ltd., Tokyo (JP)

( * ) Notice: Subject to any disclaimer, the term of this patent is extended or adjusted under 35 U.S.C. 154(b) by 245 days.

(21) Appl. No.: 13/395,822

(22) PCT Filed: Sep. 9, 2010

(86) PCT No.: PCT/JP2010/065549
§ 371 (c)(1),
(2), (4) Date: Mar. 13, 2012

(87) PCT Pub. No.: WO2011/033990
PCT Pub. Date: Mar. 24, 2011

(65) Prior Publication Data
US 2012/0168053 A1     Jul. 5, 2012

(30) Foreign Application Priority Data

Sep. 17, 2009  (JP) ................. 2009-215568

(51) Int. Cl.
| B32B 37/04 | (2006.01) |
| B32B 15/08 | (2006.01) |
| B32B 37/10 | (2006.01) |
| H05K 3/02 | (2006.01) |
| B32B 15/20 | (2006.01) |
| B32B 27/34 | (2006.01) |
| H05K 1/03 | (2006.01) |

(52) U.S. Cl.
CPC ............. H05K 3/022 (2013.01); B32B 15/08 (2013.01); B32B 37/1027 (2013.01);
(Continued)

(58) Field of Classification Search
USPC .................. 156/64, 308.2, 309.6, 324, 583.5
See application file for complete search history.

(56) References Cited

U.S. PATENT DOCUMENTS 4,228,481 A * 10/1980 DiNicola et al. .............. 361/314
5,120,590 A *  6/1992 Savage et al. .................. 428/76
2006/0054262 A1  3/2006 Kikuchi et al.

FOREIGN PATENT DOCUMENTS

CN      1717322 A    1/2006
JP      05-147054 A  6/1993
(Continued)

OTHER PUBLICATIONS

Machine Translation of Tomohiko et al. (JP2001-270033) (Note the orginal document was submitted in the IDS filed Mar. 13, 2012).*

(Continued)

Primary Examiner — Christopher Schatz
Assistant Examiner — Scott W Dodds
(74) Attorney, Agent, or Firm — Seager, Tufte & Wickhem LLC

(57) ABSTRACT

A method for producing a flexible metal laminate includes continuously thermocompression-bonding laminate metal foils to a resin film. The thermocompression-bonding step is conducted by placing a protection metal foil between a pressure surface of a heat and pressure forming apparatus and the laminate metal foils. When the protection metal foil is subjected to an abrasion resistance test, in which the protection metal foil is placed such that a matte surface of the protection metal foil contacts a plate material having a surface equivalent to the pressure surface and in which the matte surface is rubbed against the surface of the plate material by applying a load to a shiny surface of the protection metal foil and pulling the protection metal foil, a streak is found on the matte surface only in a case where the load is over 500 g per area of 76 mm×26 mm.

4 Claims, 3 Drawing Sheets

(52) U.S. Cl.
CPC ... *B32B 2307/406* (2013.01); *H05K 2201/0355* (2013.01); *B32B 15/20* (2013.01); *B32B 27/34* (2013.01); *H05K 2203/068* (2013.01); *B32B 2307/408* (2013.01); *H05K 1/0393* (2013.01); *B32B 2311/00* (2013.01); *B32B 2379/08* (2013.01); *H05K 2203/1545* (2013.01)
USPC .................... 156/308.2; 156/309.6; 156/324; 156/583.5

(56) References Cited

FOREIGN PATENT DOCUMENTS

| | | | |
|---|---|---|---|
| JP | 5147054 | A | 6/1993 |
| JP | 2001-270033 | A | 10/2001 |
| JP | 2001270033 | A | 10/2001 |
| JP | 2002-064258 | A | 2/2002 |
| JP | 2005-280153 | A | 10/2005 |
| JP | 2005280153 | A | 10/2005 |
| JP | 2008-030385 | A | 2/2008 |
| JP | 200830385 | A | 2/2008 |
| JP | 2005-205731 | A | 3/2012 |

OTHER PUBLICATIONS

Copy of Corresponding International Preliminary Report on Patentability and Written Opinion PCT/JP2010/065549 Dated Oct. 12, 2010.

* cited by examiner

METHOD FOR PRODUCING FLEXIBLE METAL LAMINATE

TECHNICAL FIELD

The present invention relates to a method for producing a flexible metal laminate using a heat and pressure forming apparatus.

BACKGROUND ART

A flexible metal laminate applied to, for example, an electronic device is produced through a step of continuously thermocompression-bonding laminate metal foils to a thermocompression resin film. In this thermocompression-bonding step, a heat and pressure forming apparatus is used and a protection metal foil for protecting the laminate metal foils is placed between a pressure surface of the heat and pressure forming apparatus and the laminate metal foils (see Patent Documents 1 to 3).

PRIOR ART DOCUMENTS

Patent Document 1: Japanese Laid-Open Patent Publication No. 2001-270033
Patent Document 2: Japanese Laid-Open Patent Publication No. 2005-205731
Patent Document 3: Japanese Laid-Open Patent Publication No. 2002-064258

SUMMARY OF THE INVENTION

Problems that the Invention is to Solve

However, when elongated flexible metal laminates are continuously produced by thermocompression-bonding using a heat and pressure forming apparatus, the laminates may be damaged to a predetermined level or above, which causes a poor appearance, even if a protection metal foil is used. Especially, as circuits have become more and more fine-pitched in recent years, there is a stricter requirement about the appearance of flexible metal laminates. Therefore, according to a conventional production method, along with such a stricter requirement, the frequency of flexible metal laminates of poor appearance is likely to increase. This causes the productivity of flexible metal laminates to degrade, which in turn causes the industrial waste and the energy consumption to increase.

The present invention is made in view of such circumstances, and its objective is to provide a method for producing flexible metal laminates in which the occurrence of poor appearance can be easily suppressed.

Means for Solving the Problems

To achieve the foregoing objective and in accordance with one aspect of the present invention, a method for producing a flexible metal laminate is provided that includes a step of continuously thermocompression-bonding a laminate metal foil to at least one side of a thermocompression resin film using a heat and pressure forming apparatus. The step of thermocompression-bonding is conducted placing a protection metal foil for protecting the laminate metal foil between a pressure surface of the heat and pressure forming apparatus and the laminate metal foil. The protection metal foil has a shiny surface and a matte surface, which is more rough-surfaced than the shiny surface. In the step of thermocompression-bonding, the protection metal foil is used such that the matte surface contacts the pressure surface of the heat and pressure forming apparatus. When the protection metal foil is subjected to an abrasion resistance test, in which the protection metal foil is placed such that the matte surface contacts a plate material having a surface equivalent to the pressure surface of the heat and pressure forming apparatus and in which the matte surface of the protection metal foil is rubbed against the surface of the plate material by applying a load to the shiny surface and pulling the protection metal foil in a given direction, a streak is found on the matte surface of the protection metal foil only in a case where the load is over 500 g per area of 76 mm×26 mm.

Preferably, when the protection metal foil is subjected to the abrasion resistance test, a trail is found on the matte surface of the protection metal foil only in a case where the load is over 200 g per area of 76 mm×26 mm.

Preferably, the metal foil is a copper foil, or more specifically an electrolyte copper foil.

The metal foil preferably has a thickness of less than 35 μm.

The thermocompression resin film is preferably a multilayer aromatic polyimide film.

Effects of the Invention

According to one aspect of the present invention, it is possible to provide a method for producing flexible metal laminates in which the occurrence of poor appearance can be easily suppressed.

MODES FOR CARRYING OUT THE INVENTION

Figure 1:
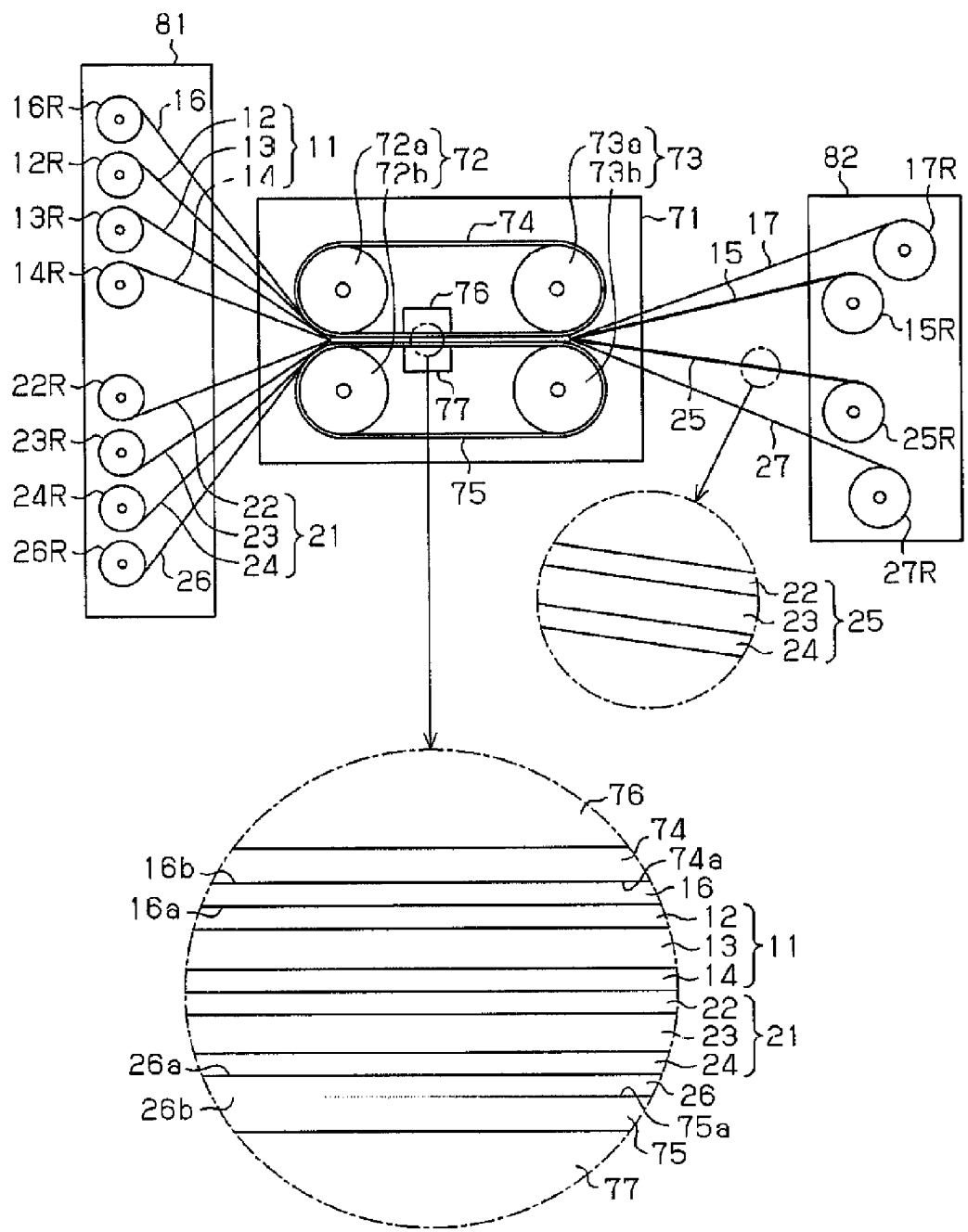
FIG. 1 is a schematic diagram of a thermocompression-bonding step in a method according to one embodiment of the present invention.

In the following, a method for producing a flexible metal laminate according to one embodiment of the present invention will be described with reference to FIGS. 1 and 2.

In a method according to the present embodiment, a flexible metal laminate is produced through a step of continuously thermocompression-bonding laminate metal foils to both surfaces of a thermocompression resin film. This thermocompression-bonding step is conducted in a production line as shown in FIG. 1. The production line shown in FIG. 1 is provided with: a double belt press apparatus 71; a supplying portion 81 that continuously supplies a first group of materials to be thermocompression-bonded 11 and a second group of materials to be thermocompression-bonded 21 to the double belt press apparatus 71; and a winding portion 82 that continuously winds a first flexible metal laminate 15 and a second flexible metal laminate 25, which are carried out from the double belt press apparatus 71. The first flexible metal laminate 15 is produced by thermocompression-bonding the first group of materials 11 and the second flexible metal laminate 25 is produced by thermocompression-bonding the second group of materials 21. The first flexible metal laminate 15 and the second flexible metal laminate 25 are simultaneously produced.

The first group of materials to be thermocompression-bonded 11 is specifically configured with a laminate metal foil 12, a thermocompression resin film 13, and a laminate metal foil 14. The first flexible metal laminate 15 is formed by laminating and thermocompression-bonding the laminate metal foil 12, the thermocompression resin film 13, and the laminate metal foil 14 in that order. The second group of materials to be thermocompression-bonded 21 is specifically configured with a laminate metal foil 22, a thermocompression resin film 23, and a laminate metal foil 24. The second flexible metal laminate 25 is formed by laminating and thermocompression-bonding the laminate metal foil 22, the thermocompression resin film 23, and the laminate metal foil 24 in that order.

In the double belt press apparatus 71, first and second protection metal foils 16 and 26 to protect the laminate metal foils 12 and 24 are supplied from the supplying portion 81 in addition to the materials to be thermocompression-bonded 11 and 21. For the protection metal foils 16 and 26, metal foils selected from various metal foils through an abrasion resistance test are used.

The laminate metal foils 12, 14, 22 and 24, the thermocompression resin films 13 and 23, and the protection metal foils 16 and 26 each have a long shape and are each wound in a roll shape and placed in the supplying portion 81. That is, the supplying portion 81 contains four laminate metal foil rolls 12R, 14R, 22R and 24R and two thermocompression resin film rolls 13R and 23R, from which the laminate metal foils 12, 14, 22 and 24 and the thermocompression resin films 13 and 23 are supplied. By this means, the first materials to be thermocompression-bonded 11 and the second materials to be thermocompression-bonded 21 can be continuously supplied to the double belt press apparatus 71. Further, two protection metal foil rolls 16R and 26R are placed in the supplying portion 81, so that the first protection metal foil 16 to protect the first materials 11 and the second protection metal foil 26 to protect the second materials 21 can be continuously supplied to the double belt press apparatus 71. The first protection metal foil 16 has a shiny surface 16$a$ and a matte surface 16$b$ that is more rough-surfaced than the shiny surface 16$a$. The second protection metal foil 26 has a shiny surface 26$a$ and a matte surface 26$b$ that is more rough-surfaced than the shiny surface 26$a$. The protection metal foils 16 and 26 are supplied so as to sandwich the materials to be thermocompression-bonded 11 and 21 between the shiny surfaces 16$a$ and 26$a$.

In the double belt press apparatus 71, the materials to be thermocompression-bonded 11 and 21 and the protection metal foils 16 and 26 are conveyed and the materials 11 and 21 are thermocompression-bonded. The double belt press apparatus 71 has a first conveying portion 72 located on the upstream side of the conveying direction and a second conveying portion 73 located on the downstream side of the conveying direction. The first conveying portion 72 is provided with an upper first drum 72$a$ and a lower first drum 72$b$. The second conveying portion 73 is provided with an upper second drum 73$a$ and a lower second drum 73$b$. The upper first drum 72$a$ and the upper second drum 73$a$ are provided with an endless upper belt 74. The lower first drum 72$b$ and the lower second drum 73$b$ are provided with an endless lower belt 75. The upper first drum 72$a$ is driven via the upper belt 74 by activating the upper second drum 73$a$. The lower first drum 72$b$ is driven via the lower belt 75 by activating the lower second drum 73$b$. The belts 74 and 75 are each formed of stainless steels to prevent corrosion.

The materials to be thermocompression-bonded 11 and 21 are supplied in an overlapped manner between the belts 74 and 75 of the double belt press apparatus 71. The first protection metal foil 16 is supplied between the first materials to be thermocompression-bonded 11 and the upper belt 74, and the second protection metal foil 26 is supplied between the second materials to be thermocompression-bonded 21 and the lower belt 75. Further, the materials to be thermocompression-bonded 11 and 21 and the protection metal foils 16 and 26 are conveyed in synchronization between the belts 74 and 75.

An upper pressure portion 76 and a lower pressure portion 77 are placed in a facing manner via the belts 74 and 75, between the first conveying portion 72 and the second conveying portion 73. The upper and lower pressure portions 76 and 77 can be heated. When the materials to be thermocompression-bonded 11 and 21 pass between the pressure portions 76 and 77, the groups of materials 11 and 21 are each heated and pressurized in the pressure portions 76 and 77 via the belts 74 and 75 and the protection metal foils 16 and 26 and then thermocompression-bonded. At this time, the first protection metal foil 16 protects the laminate metal foil 12 from a pressure surface 74$a$ by preventing the laminate metal foil 12 from contacting an outer periphery (or the pressure surface 74$a$) of the upper belt 74. Further, the second protection metal foil 26 protects the laminate metal foil 24 from a pressure surface 75$a$ by preventing the laminate metal foil 24 from contacting an outer periphery (or the pressure surface 75$a$) of the lower belt 75. The shiny surfaces 16$a$ and 26$a$ of the protection metal foils 16 and 26 are lustered by smoothing, so that it is possible to avoid an influence given to the appearances of the laminate metal foils 12 and 24 as much as possible by contacting the shiny surfaces 16$a$ and 26$a$ to the laminate metal foils 12 and 24. Also, if there is asperity on the pressure surfaces 74$a$ and 75$a$, the asperity may be printed on the laminate metal foils 12 and 24 via the protection metal foils 16 and 26. In the case of the present embodiment, however, as the pressure surfaces 74$a$ and 75$a$ have higher smoothness by mirror finish, it is possible to avoid such a problem.

The flexible metal laminates 15 and 25 formed by thermocompression-bonding in this way are conveyed to the second conveying portion 73 and then conveyed out of the double belt press apparatus 71. The present embodiment employs a configuration in which the flexible metal laminates 15 and 25 are cooled in an area of a more downstream side in the conveying direction than the pressure portions 76 and 77.

The winding portion 82 winds the flexible metal laminates 15 and 25 conveyed out of the double belt press apparatus 71, individually. By this means, it is possible to obtain a first flexible metal laminate roll 15R and a second flexible metal laminate roll 25R from the first and second flexible metal laminates 15 and 25, respectively. The protection metal foils 17 and 27 conveyed out of the double belt press apparatus 71 are wound and collected in the winding portion 82 as protection metal foil collection rolls 17R and 27R, respectively.

Next, each layer configuration of the flexible metal laminates 15 and 25 will be described.

The laminate metal foils 12, 14, 22 and 24 play a role as a conductive layer in the flexible metal laminates 15 and 25. The laminate metal foils 12, 14, 22 and 24 may be a copper foil, an aluminum foil, or a foil formed of an alloy of copper and aluminum. Preferably, the laminate metal foils 12, 14, 22 and 24 are formed of at least one kind selected from a rolled copper foil, an electrolytic copper foil, and an aluminum foil.

The surface roughness of the laminate metal foils 12, 14, 22 and 24 is not specifically limited, but, in the ten-point average roughness (Rz), the surface roughness is preferably from 0.5 to 10 μm and more preferably from 0.5 to 7 μm. The thickness of the laminate metal foils 12, 14, 22 and 24 is preferably from 3 to 40 μm, more preferably from 3 to 35 μm, and further preferably from 8 to 35 μm.

The thermocompression resin films 13 and 23 can play a role as an insulation layer and be thermocompression-bonded to the laminate metal foils 12, 14, 22 and 24. The thermocompression resin films 13 and 23 are preferably multilayer aromatic polyimide films because they have good dimensional stability at the time of thermocompression-bonding and are less likely to cause problems such as wrinkles in the laminate metal foils 12, 14, 22 and 24. The multilayer aromatic polyimide film is made by forming thermocompression-bondable polyimide layers in both surfaces of a non-compression-bondable aromatic polyimide film. For example, marketed products such as Upilex-VT (name of commodity) produced by Ube Industries, Ltd. are available as a multilayer aromatic polyimide film. Such a multilayer aromatic polyimide film is disclosed also in, for example, Patent Document 1.

Instead of multilayer aromatic polyimide films, the thermocompression resin films 13 and 23 may be, for example, thermocompression-bondable single-layer polyimide films or single-layer/multilayer various resin films such as a thermocompression-bondable polyester film (including a liquid crystal film), a thermocompression-bondable polyamide film (including an aramid film), a thermocompression-bondable vinylester film, and a thermocompression-bondable fluorine resin film.

The thickness of the thermocompression resin films 13 and 23 is not specifically limited but is preferably from 5 to 150 μm, more preferably from 6 to 100 μm, further preferably from 7 to 50 μm, and particularly preferably from 8 to 25 μm.

Next, the protection metal foils 16 and 26 used in a thermocompression-bonding step will be described.

Figure 2A:
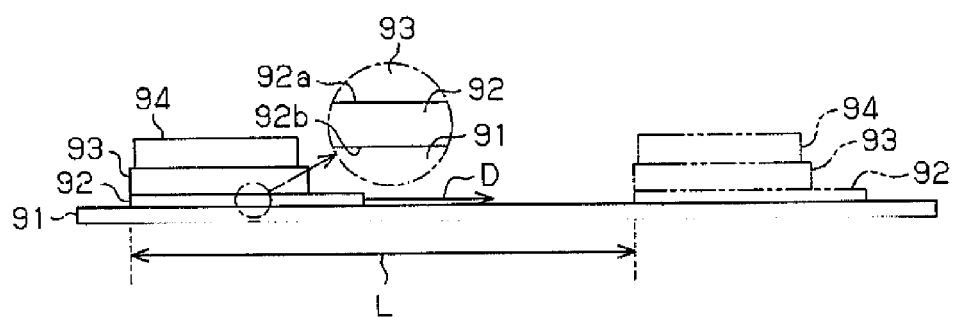
FIG. 2(a) is a schematic front view of an apparatus for conducting an abrasion resistance test.
Figure 2B:
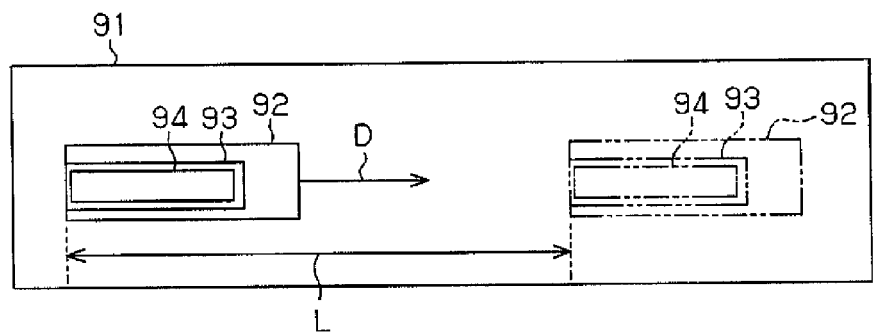
FIG. 2(b) is a schematic plan view of the apparatus shown in FIG. 2(a)

Metal foils selected from various metal foils through an abrasion resistance test are used as the protection metal foils 16 and 26. As shown in FIGS. 2(a) and 2(b), in the abrasion resistance test, a metal foil 92, which is one of various metal foils, is placed on a planar upper surface of a stainless steel plate 91. The metal foil 92 has a shiny surface 92a lustered by smoothing and a matte surface 92b that is more rough-surfaced than the shiny surface 92a. The metal foil 92 is placed on the stainless steel plate 91 such that the matte surface 92b contacts the upper surface of the stainless steel plate 91.

The stainless steel plate 91 is formed of the same materials as those of the pressure surfaces 74a and 75a of the double belt press apparatus 71 as described above. The upper surface of the stainless steel plate 91 is mirrored. Therefore, the upper surface of the stainless steel plate 91 is equivalent to the pressure surfaces 74a and 75a. Accordingly, it is possible to conduct a test suitable to a thermocompression-bonding step by using the stainless steel plate 91.

After the metal foil 92 is placed on the stainless steel plate 91, a weight 94 of 500 g is placed on the metal foil 92 via a glass slide 93 (76×26×1.2 mm). By this means, a predetermined load is applied to the shiny surface 92a of the metal foil 92. In FIGS. 2(a) and 2(b), for ease of explanation, the thicknesses of the metal foil 92 and the glass slide 93 are shown thicker than in reality.

Next, while the weight 94 is placed on the metal foil 92, the metal foil 92 is pulled in a given direction D and moved in the given direction D with respect to the stainless steel plate 91. At this time, there is a load of the weight 94 on a part on which the glass slide 93 is placed in the metal foil 92, and therefore the matte surface 92b of the part is slid and rubbed against the upper surface of the stainless steel plate 91. After that, the matte surface 92b of the metal foil 92 is visually examined to check whether there is a streak along the pulling direction D.

In the abrasion resistance test conducted in this way, a metal foil is sorted out that has a matte surface on which a streak is found only in a case where a load given to the metal foil is over 500 g per area of 76 mm×26 mm. The metal foil sorted out in this way is used for the protection metal foils 16 and 26. That is, when the protection metal foils 16 and 26 are subjected to the above-noted abrasion resistance test, a streak is found on the matte surfaces 16b and 26b of the protection metal foils 16 and 26 only in a case where a load given to the protection metal foils 16 and 26 is over 500 g per area of 76 mm×26 mm.

In the metal foil selection by the above-noted abrasion resistance test, a metal foil having a matte surface on which a trail is found only in a case where a load given to the metal foil is over 200 g per area of 76 mm×26 mm may be sorted out. The metal foil sorted out in this way can be suitably used as the protection metal foils 16 and 26. That is, when the protection metal foils 16 and 26 are subjected to the above-noted abrasion resistance test, it is preferable that a trail is found on the matte surfaces 16b and 26b only in a case where a load given to the protection metal foils 16 and 26 is over 200 g per area of 76 mm×26 mm. If there is a production directionality in a metal foil to be tested, the abrasion resistance test is conducted such that the production length direction (MD: Machine Direction) and the pulling direction D are parallel.

The protection metal foils 16 and 26 formed using the metal foil sorted out in this way are used in the above-noted thermocompression-bonding step in a state where the shiny surfaces 16a and 26a contact the laminate metal foils 12 and 24 and the matte surfaces 16b and 26b contact the pressure surfaces 74a and 75a of the double belt press apparatus 71.

As circuits have become more and more fine-pitched in recent years, there is a stricter requirement about the appearance of flexible metal laminates. The present inventors found that the occurrence frequency of poor appearance varied depending on a protection metal foil type. It is assumed that a poor appearance of flexible metal laminates is caused by fine powders, which are generated from a protection metal foil by rubbing a matte surface of the protection metal foil against a pressure surface of a heat and pressure forming apparatus such as a double belt press apparatus. However, it is difficult to determine, from the physicality and the appearance, a metal foil suitable as a protection metal foil that can suitably suppress a poor appearance. In this point, in the present embodiment, by forming the protection metal foils 16 and 26 using a metal foil in which no streak is found on matte surfaces in the above-noted abrasion resistance test, an occurrence of poor-appearance flexible metal laminates is suppressed. That is, according to the above-noted abrasion resistance test, it is possible to objectively and easily determine metal foils that can be suitably used as the protection metal foils 16 and 26. By this means, it is possible to continuously produce longer-shaped flexible metal laminates with no poor appearance.

Metal foils subjected to the abrasion resistance test, in other words, the protection metal foils 16 and 26 may be a copper foil, an aluminum foil, or a foil formed of an alloy of copper and aluminum. According to a result of hard investigation through the abrasion resistance test by the present inventors, the protection metal foils 16 and 26 are preferably formed of a copper foil or aluminum foil, and more preferably formed of a copper foil. The copper foil may be a rolled copper foil or an electrolytic copper foil, and is preferably an electrolytic copper foil. Specific examples of the electrolytic copper foil include GTS-MP and GY-MP produced by Furukawa Electric Co., Ltd., YGP produced by Nippon Denkai, Ltd., and ICS produced by Iljin Materials, Co., Ltd.

The thickness of the protection metal foils 16 and 26 is preferably less than 35 μm, and more preferably 8 μm and more and less than 35 μm. In a case where the thickness of the protection metal foils 16 and 26 is 35 μm or more, the protection metal foils 16 and 26 have less flexibility and therefore may be difficult to be treated and may have a disadvantage in view of economy.

A flexible metal laminate obtained by the production method of the present embodiment is used for, for example, FPC (Flexible Printed Circuit), or can be used for a tape used in a mounting method such as a TAB (Tape Automated Bonding) method and a COF (Chip On Film) method. Products on which the flexible metal laminates 15 and 25 are mounted include electronic devices such as a camera, a personal computer, a liquid crystal display, a printer, and a mobile device.

According to the present embodiment described above, the following advantages are provided.

(1) The protection metal foils 16 and 26 used in the production method of the present embodiment are formed using a metal foil having a matte surface on which a streak is found only in a case where a load given to the metal foil is over 500 g per area of 76 mm×26 mm in the above-described abrasion resistance test. By this means, it is possible to provide a method for producing flexible metal laminates in which an occurrence of poor appearance can be easily suppressed. Therefore, it is possible to continuously produce longer-shaped flexible metal laminates with no poor appearance. This improves the productivity of flexible metal laminates and reduces the industrial waste and the energy consumption.

(2) The protection metal foils 16 and 26 may be formed using a metal foil having a matte surface on which a trail is found only in a case where a load given to the metal foil is over 200 g per area of 76 mm×26 mm in the above-described abrasion resistance test. In this case, it is possible to suppress a poor appearance of flexible metal laminates more easily. By this means, even in a case where there is a stricter requirement about the appearance of flexible metal laminates, it is possible to suppress the degradation of productivity.

(3) In a case where the protection metal foils 16 and 26 are formed of copper foils and furthermore formed of electrolytic copper foils, the protection metal foils 16 and 26 are likely to have good mechanical property.

(4) In a case where the thickness of the protection metal foils 16 and 26 are less than 35 μm, the protection metal foils 16 and 26 have good flexibility and are treated easily. Further, the weights of the protection metal foils 16 and 26 used to produce the flexible metal laminates 15 and 25 are reduced, which provides an economic advantage.

(5) In a case where the thermocompression resin films 13 and 23 are multilayer aromatic polyimide films, it is possible to suppress an occurrence of problems such as wrinkles in the metal foils 12, 14, 22 and 24 at the time of thermocompression-bonding with the laminate metal foils 12, 14, 22 and 24.

The above-described embodiment may be modified as follows.

The belts 74 and 75 of the double belt press apparatus 71, particularly, the pressure surfaces 74a and 75a are not limited to be formed of stainless steels and may be formed of metal such as a copper alloy and aluminum alloy or heat resistant resins. However, they are preferably formed of stainless steels in view of durability or the like.

The belts 74 and 75 may be formed of the same material or different materials.

The pressure surfaces 74a and 75a may be formed by surface treatment such as plating. In this case, in an abrasion resistance test, instead of the stainless steel plate 91, a plate material having a surface subjected to the same surface treatment as that applied to the pressure surfaces 74a and 75a, that is, a plate material having a surface equivalent to that of the pressure surfaces 74a and 75a formed by the surface treatment is used. The phrase "equivalent to that of the pressure surfaces 74a and 75a" means that the quality of materials and the surface state are equivalent to those of the pressure surfaces 74a and 75a. A plate material used in the abrasion resistance test is preferably the same as that forming the belts 74 and 75.

In the above-described embodiment, the groups of materials to be thermocompression-bonded 11 and 21 each have a three-layer structure of a laminate metal foil, thermocompression resin film, and laminate metal foil, but at least one of the groups of materials 11 and 21 is changed to have a two-layer structure of a laminate metal foil and thermocompression resin film. In this case, the thermocompression resin film may provide thermocompression-bondable only in one surface.

Changes may be made such that, only one of the first flexible metal laminate 15 and the second flexible metal laminate 25 is produced by providing only one of the groups of materials to be thermocompression-bonded 11 and 21, instead of both them, to the double belt press apparatus 71. In this case, it is possible to omit corresponding one of the protection metal foils 16 and 26.

Instead of the double belt press apparatus 71, a roll forming apparatus that gives pressure by a pair or pairs of upper and lower heating rollers may be used as a heat and pressure forming apparatus.

Instead of winding the flexible metal laminates 15 and 25 and the protection metal foils 17 and 27 individually, the winding portion 82 may wind the flexible metal laminate 15 and the protection metal foil 17 together or wind the flexible metal laminate 25 and the protection metal foil 27 together. In this case, the protection metal foils 17 and 27 are separated from the flexible metal laminates 15 and 25 at the time of using the flexible metal laminates 15 and 25.

Some technical ideas found from the above-described embodiment will be described below.

A protection metal foil used in production of a flexible metal laminate is provided. The production includes a step of continuously thermocompression-bonding a laminate metal foil to at least one side of a thermocompression resin film using a heat and pressure forming apparatus. In the thermocompression-bonding step, the protection metal foil is placed between a pressure surface of the heat and pressure forming apparatus and the laminate metal foil to protect the laminate metal foil. The protection metal foil is characterized in that the protection metal foil has a shiny surface and a matte surface that is more rough-surfaced than the shiny surface; and, when the protection metal foil is subjected to an abrasion resistance test, in which the protection metal foil is placed such that the matte surface contacts a plate material having a surface equivalent to the pressure surface of the heat and pressure forming apparatus and in which the matte surface of the protection metal foil is rubbed against the surface of the plate material by applying a load to the shiny surface and pulling the protection metal foil in a given direction, a streak is found on the matte surface of the protection metal foil only in a case where the load is over 500 g per area of 76 mm×26 mm. By this protection metal foil, it is possible to easily suppress a poor appearance of flexible metal laminates in production of the flexible metal laminates.

A method for selecting a metal foil to form a protection metal foil used in production of a flexible metal laminate is provided. The production includes a step of continuously thermocompression-bonding a laminate metal foil to at least one side of a thermocompression resin film using a heat and pressure forming apparatus. In the thermocompression-bonding step, the protection metal foil is placed between a pressure surface of the heat and pressure forming apparatus and the laminate metal foil to protect the laminate metal foil. The method is characterized by a step of conducting an abrasion resistance test, in which a metal foil having a shiny surface and a matte surface that is more rough-surfaced than the shiny surface is placed on the plate material having a surface equivalent to the pressure surface of the heat and pressure forming apparatus and in which the matte surface of the metal foil is rubbed against the surface of the plate material by applying a load to the shiny surface and pulling the protection metal foil in a given direction. In the abrasion resistance test, as the protection metal foil, a metal foil is selected in which a streak is found on the matte surface only in a case where the load is over 500 g per area of 76 mm×26 mm. By this method, it is possible to easily select a protection metal foil that can suitably suppress a poor appearance of flexible metal laminates, from various metal foils.

In the method for producing a flexible metal laminate, the heat and pressure forming apparatus is a double belt press apparatus.

In the method for producing a flexible metal laminate, the pressure surface is formed of a stainless steel.

Next, the above-described embodiment will be described below in detail using examples and comparison examples.

EXAMPLES 1 TO 6 AND COMPARISON EXAMPLES 1 AND 2

An abrasion resistance test was conducted on metal foils A to H shown in table 1 using a stainless steel having a mirrored upper surface. The metal foils A to H each were an electrolytic copper foil. In this abrasion resistance test, the speed of pulling the metal foils was 1,000 mm/min and the rubbing distance shown as "L" in FIGS. 2(a) and 2(b) was 100 mm. Further, a measurement environment was that the temperature was 23° C. and the relative humidity was 40%.

Figure 3:
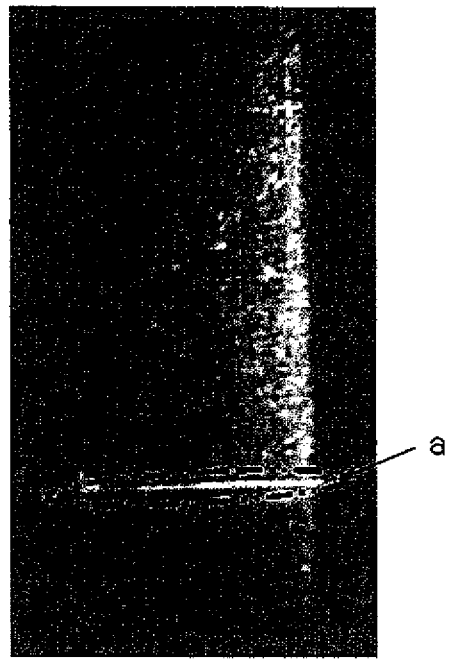
FIG. 3 shows a picture of streak found in the abrasion resistance test.
Figure 4:
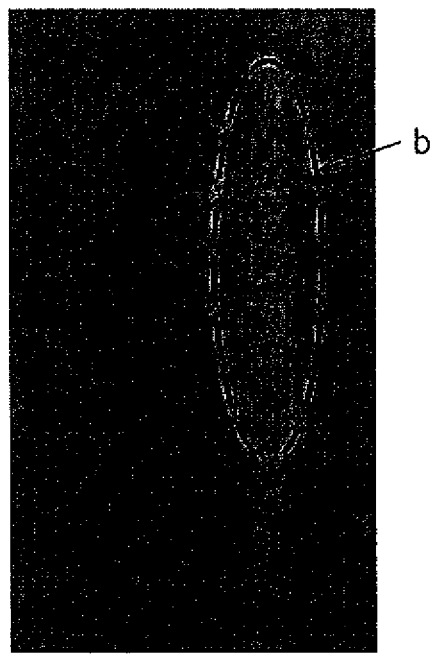
FIG. 4 shows a picture of trail found in the abrasion resistance test.

Table 1 shows the results of determining whether there was a streak having a width of 7 μm or more on a matte surface as represented by reference numeral "a" in FIG. 3 after the abrasion resistance test was conducted using a load of 500 g (which was the weight of the weight 94 shown in FIGS. 2(a) and 2(b)). Further, Table 1 shows the results of checking whether there was a trail on a matte surface as represented by reference numeral "b" in FIG. 4 after the abrasion resistance test was conducted using loads of 200 g and 300 g (which were the weight of the weight 94 shown in FIGS. 2(a) and 2(b)).

TABLE 1

|  | Metal foil | | Abrasion resistance test | | | Productivity evaluation |
|---|---|---|---|---|---|---|
|  | Type | Thickness (μm) | Load: 500 g Presence or non-presence of streak | Load: 200 g Presence or non-presence of trail | Load: 300 g | |
| Example 1 | A | 18 | non-presence | non-presence | non-presence | A+ |
| Example 2 | B | 18 | non-presence | non-presence | Presence | A |
| Example 3 | C | 18 | non-presence | non-presence | Presence | A |
| Example 4 | D | 12 | non-presence | presence | Presence | A− |
| Example 5 | E | 18 | non-presence | presence | Presence | A− |
| Example 6 | F | 18 | non-presence | presence | Presence | A− |
| Comparison Example 1 | G | 18 | presence | presence | presence | C |
| Comparison Example 2 | H | 18 | presence | presence | presence | C |

As shown in Table 1, no streak was found in the metal foils A to F. Among the metal foils A to F, no trail was found in the metal foils A to C with a load of 200 g. Particularly, no trail was found in the metal foil A even with a load of 300 g. By contrast with this, a streak was found in the metal foils G and H.

Next, using a metal foil roll formed of each of the metal foils A to H as a protection metal foil roll, a production test of flexible metal laminates was conducted by the double belt press apparatus 71 shown in FIG. 1. The belts 74 and 75 of the used double belt press apparatus 71 were formed of stainless steels having the mirrored pressure surfaces 74a and 75a. In this production test, the appearances of the laminate metal foils 12 and 24 of flexible metal laminates obtained continuously were visually examined. If a clearly poor appearance was found, the production test was terminated at that time, and, if no poor appearance was found, the production test continued until the winding length of the flexible metal laminate exceeded 100,000 m. Then, the productivity was evaluated according to the standard shown below. The appearance check was performed in contradistinction to a limit sample of poor appearance. The evaluation results were shown in Table 1.

A+: A poor appearance did not occur until the winding length of flexible metal laminate exceeded 100,000 m.

A: A poor appearance did not occur until the winding length of flexible metal laminate exceeded 50,000 m.

A–: A poor appearance did not occur until the winding length of flexible metal laminate exceeded 20,000 m.

B: A poor appearance did not occur until the winding length of flexible metal laminate exceeded 25,000 m.

C: A poor appearance occurred by the time the winding length of flexible metal laminate reached 25,000 m.

As shown in Table 1, from the results of Comparison Examples 1 and 2, it was found that, when the metal foils G and H were used as the protection metal foils 16 and 26, a poor appearance occurred by the time that length reached 25,000 meters. By contrast with this, from the results of Examples 1 to 6, when the metal foils A to F were used as the protection metal foils 16 and 26, a poor appearance did not occur until that length exceeded 20,000 m, and therefore it was found that the productivity was high. Also, from the results of Examples 1 to 3, when the metal foils A to C were used as the protection metal foils 16 and 26, a poor appearance did not occur until that length exceeded 50,000 m. Particularly, in the case of Example 1 using the metal foil A, a poor appearance did not occur until that length exceeded 100,000 m, and therefore it was found that the productivity was especially high.

The invention claimed is:

1. A method for producing a flexible metal laminate, comprising a step of continuously thermocompression-bonding a laminate metal foil to at least one side of a thermocompression resin film using a heat and pressure forming apparatus, wherein the step of thermocompression-bonding is conducted placing a protection metal foil for protecting the laminate metal foil between a pressure surface of the heat and pressure forming apparatus and the laminate metal foil, the protection metal foil has a shiny surface and a matte surface, which is more rough-surfaced than the shiny surface, wherein, in the step of thermocompression-bonding, the protection metal foil is used such that the matte surface contacts the pressure surface of the heat and pressure forming apparatus, and when the protection metal foil is subjected to an abrasion resistance test, in which the protection metal foil is placed such that the matte surface contacts a plate material having a surface equivalent to the pressure surface of the heat and pressure forming apparatus and in which the matte surface of the protection metal foil is rubbed against the surface of the plate material by applying a load to the shiny surface and pulling the protection metal foil in a given direction, a streak is found on the matte surface of the protection metal foil only in a case where the load is over 500 g per area of 76 mm×26 mm, wherein the protection metal foil is an electrolytic copper foil.

2. The method according to claim 1, wherein when the protection metal foil is subjected to the abrasion resistance test, a trail is found on the matte surface of the protection metal foil only in a case where the load is over 200 g per area of 76 mm×26 mm.

3. The method according to claim 1, wherein the protection metal foil has a thickness of less than 35 μm.

4. The method according to claim 1, wherein the thermocompression resin film is a multilayer aromatic polyimide film.

* * * * *